United States Patent [19]

Janko

[11] Patent Number: 5,015,946
[45] Date of Patent: May 14, 1991

[54] HIGH DENSITY PROBE

[75] Inventor: Bozidar Janko, Portland, Oreg.

[73] Assignee: Tektronix, Inc., Beaverton, Oreg.

[21] Appl. No.: 484,334

[22] Filed: Feb. 26, 1990

[51] Int. Cl.$^5$ .......................... G01R 1/02; G01R 1/04
[52] U.S. Cl. ............................... 324/158 F; 324/72.5;
324/158 P; 439/55; 439/72
[58] Field of Search ............... 439/331, 333, 524, 532,
439/533, 540, 544, 549, 552, 553, 569, 575, 219,
330, 55, 68, 72, 73; 324/158 P, 158 F, 72.5

[56] References Cited

U.S. PATENT DOCUMENTS

| 3,335,327 | 8/1967 | Damon et al. | 439/331 |
| 4,349,238 | 9/1982 | Showman et al. | 439/331 |
| 4,833,404 | 5/1989 | Meyer et al. | 324/158 P |

FOREIGN PATENT DOCUMENTS

| 0003281 | 1/1988 | Japan | 324/158 F |
| 0300977 | 12/1988 | Japan | 324/158 F |
| 0012480 | 1/1989 | Japan | 439/331 |
| 6800341 | 7/1968 | Netherlands | 324/158 F |
| 1325383 | 7/1987 | U.S.S.R. | 324/158 F |

OTHER PUBLICATIONS

"Super-Tester IC Flat Packs", by Azimuth Elect., 12/66, part #5124.

"IC Socket Takes Chip Carriers", by *Electronics*, 11/11/76, pp. 152 and 154.

*Primary Examiner*—Kenneth Wieder
*Assistant Examiner*—William J. Burns
*Attorney, Agent, or Firm*—Francis I. Gray

[57] ABSTRACT

A high density probe for probing an integrated circuit package in situ on a circuit board has a probe body with a skirt that has alignment surfaces for mating with the package to provide an initial alignment. An alignment plate is elastically mounted within the probe housing internal of the skirt. The alignment plate has serrations between pin holes, the pin holes corresponding to probe pins elastically mounted on the probe housing in a pattern matching the leads of the integrated circuit package. When the probe is pressed down over the integrated circuit package the alignment surfaces within the skirt align the probe to the package, and the serrations mesh with the leads to align the probe pins with the leads, the probe pins extending through the pin holes and maintaining positive contact due to the elastic mounting of the pins. A base plate having a central aperture with comblike teeth extending into the aperture may first be placed over the integrated circuit package with the teeth meshing with the leads to provide a surface to mate with the alignment surfaces within the skirt.

3 Claims, 4 Drawing Sheets

HIGH DENSITY PROBE

BACKGROUND OF THE INVENTION

The present invention relates to electrical contact probes, and more particularly to a high density probe suitable for contacting the high density leads of integrated circuit devices, the high density probe registering locally with the device rather than globally with the board upon which the device is mounted.

As integrated circuit technology progresses the circuitry contained in an integrated circuit package becomes more and more compact, resulting in smaller packages and higher lead densities. To test these integrated circuits packages when installed on a board in a completed system several techniques have been used. In the factory a large probe machine that globally registers with the board may be used to precisely probe any desired lead of any integrated circuit package regardless of any local misregistration of the package since the leads themselves are precisely registered. However for field use with logic analyzers or multi-channel oscilloscopes it is not feasible to have such large probe machines. Therefore probes have been developed that fit into the integrated circuit sockets on the board, with the integrated circuit then being mounted on the probe. This is feasible so long as the integrated circuit package is not fixed to the board. Alternatively when the integrated circuit package is fixed to the board, such as is the case for a surface mount package, various types of grabber probes have been developed to grab individual leads of the integrated circuit package. As the density of the leads increases the danger of shorting adjacent leads with the grabber probes also increases. For lead densities of 0.025" and less between lead centers it becomes extremely difficult to successfully test, or probe, the integrated circuit package.

Therefore what is desired is a high density probe that can be precisely registered locally with an integrated circuit package and that precisely aligns the probe pins with the leads of the integrated circuit package.

SUMMARY OF THE INVENTION

Accordingly the present invention provides a high density probe that is locally registerable with an integrated circuit package to be probed, the pins of the probe being precisely aligned with the leads of the integrated circuit package. A probe housing has a central aperture that fits over the integrated circuit package and that has interior alignment surfaces that engage the corners of the package. Probe pins are elastically mounted within holes located at the periphery of the central aperture, the holes having a density and pattern corresponding to the density and pattern of the leads of the integrated circuit package. The probe pins are electrically coupled to a connector interface that may be coupled to an instrument for displaying the electrical signals from the leads. Interior of the probe housing is elastically mounted a fine alignment plate also having a central aperture, the holes being aligned with the probe pin holes of the probe housing. The side of the fine alignment plate facing the top of the integrated circuit package has a series of serrations between the holes. When the probe housing is placed over the integrated circuit package and aligned by the alignment surfaces with the package, the probe is pressed down on the package. The serrations of the fine alignment plate then mesh with the leads of the package and the probe pins extend through the alignment plate holes to contact the leads without danger of shorting adjacent leads.

Alternatively a base plate having a central aperture with comblike teeth extending into the aperture may be placed about the integrated circuit package with the teeth meshing with the leads to provide registration. The interior surface of the probe housing fits about the exterior edge of the base plate to provide the registration with the package without the danger of damaging leads adjacent to the registration surfaces.

The objects, advantages and other novel features of the present invention are apparent from the following detailed description when read in conjunction with the appended claims and attached drawing.

DESCRIPTION OF THE PREFERRED EMBODIMENT

Figure 1:
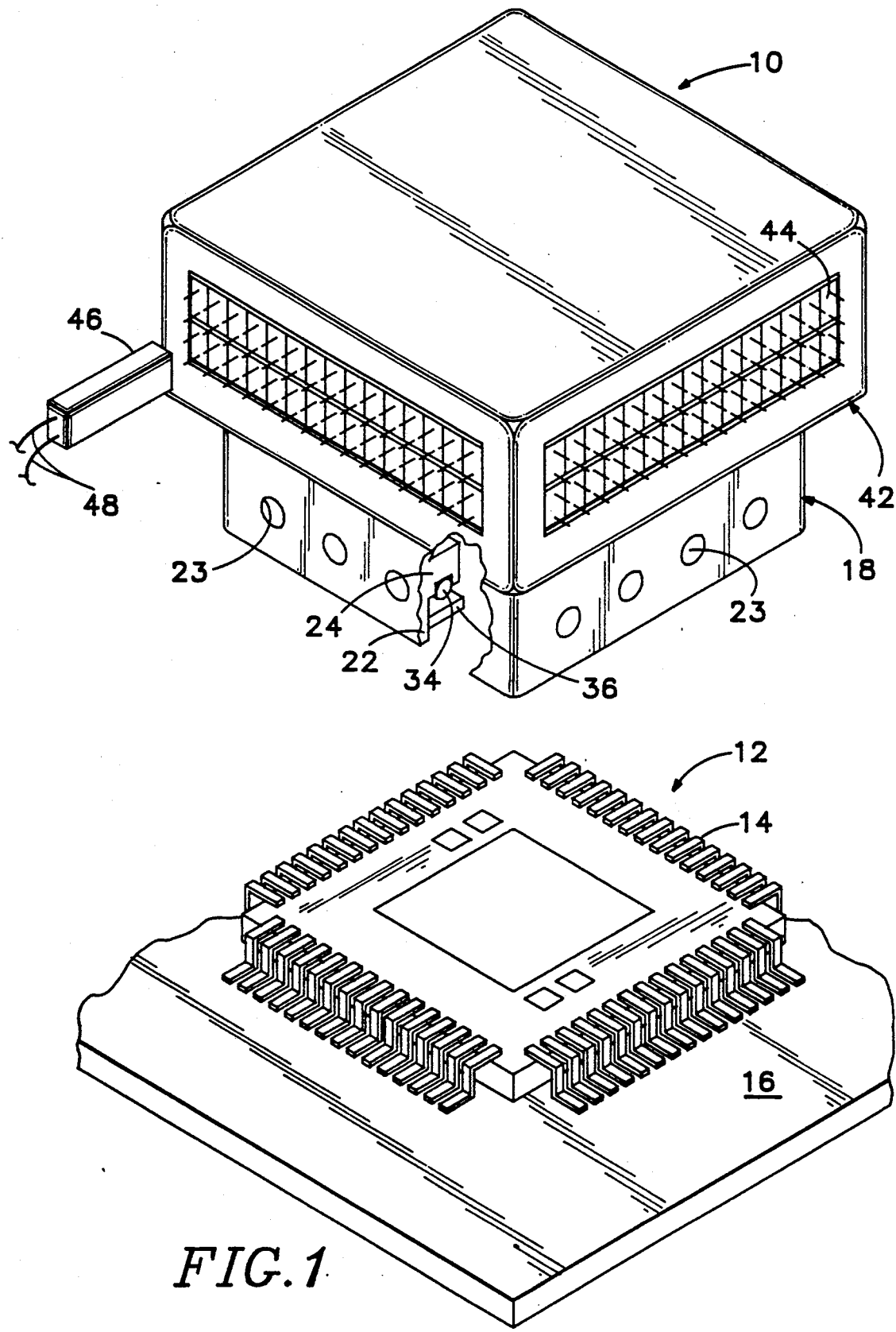
FIG. 1 is a perspective view of a high density probe according to the present invention.
Figure 2:
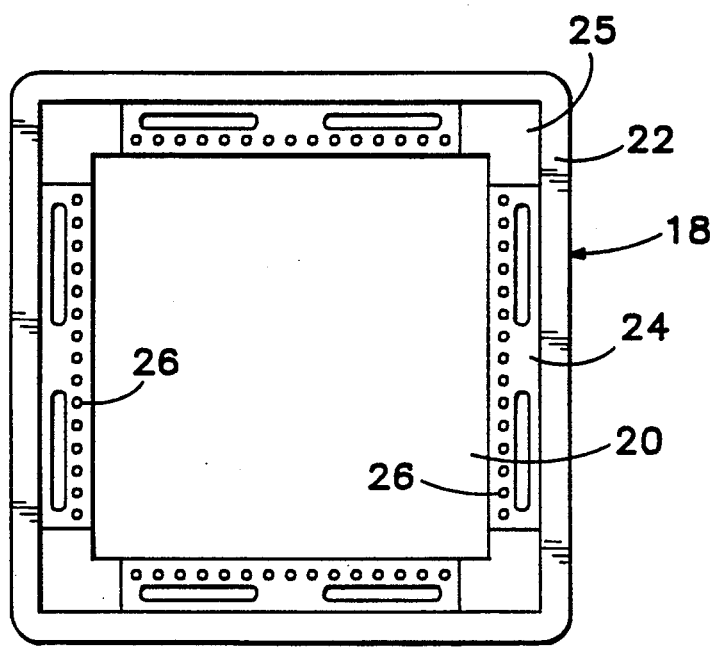
FIG. 2 is a bottom plan view of a probe housing for a high density probe according to the present invention.
Figure 3:
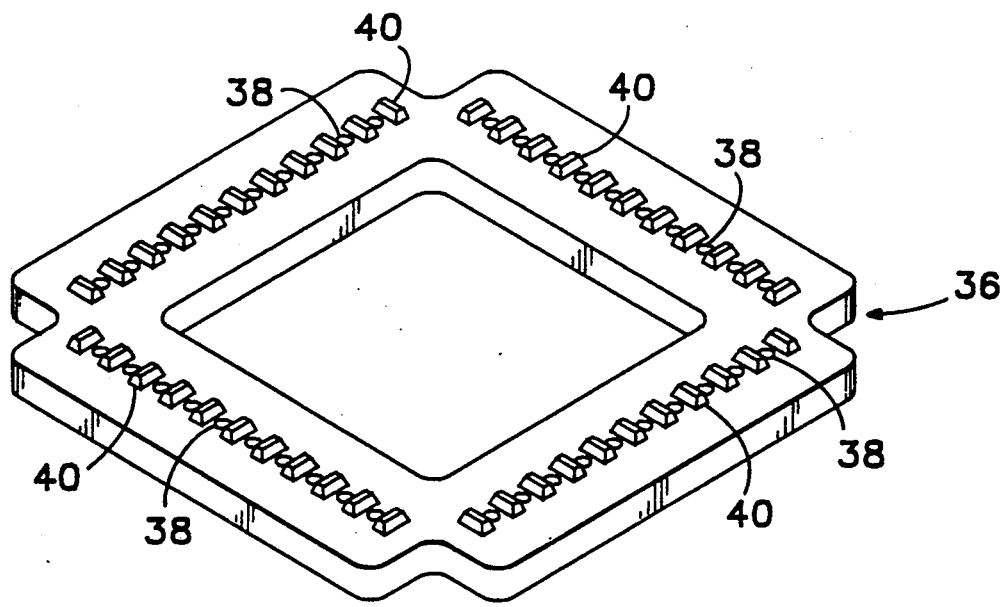
FIG. 3 is a perspective view of a fine alignment plate for a high density probe according to the present invention.
Figure 4A:
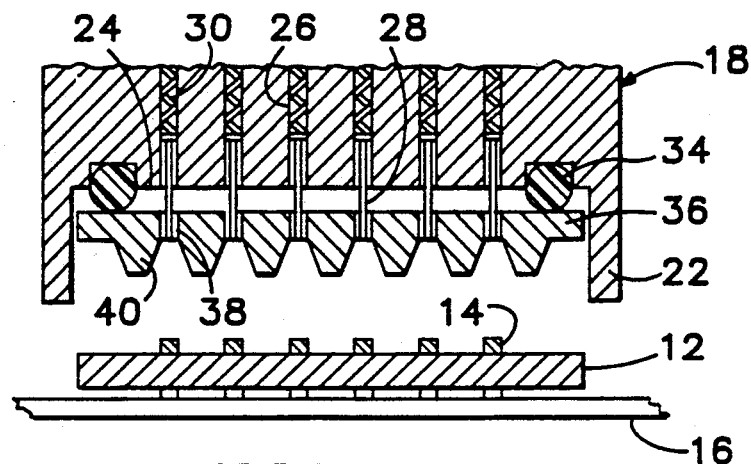
FIG. 4a-FIG. 4c illustrative cross-sectional views of a portion of the high density probe according to the present invention.
Figure 4B:
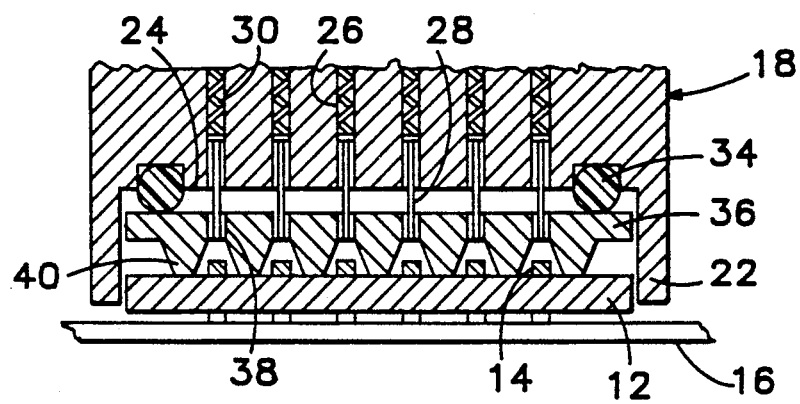
Figure 4C:
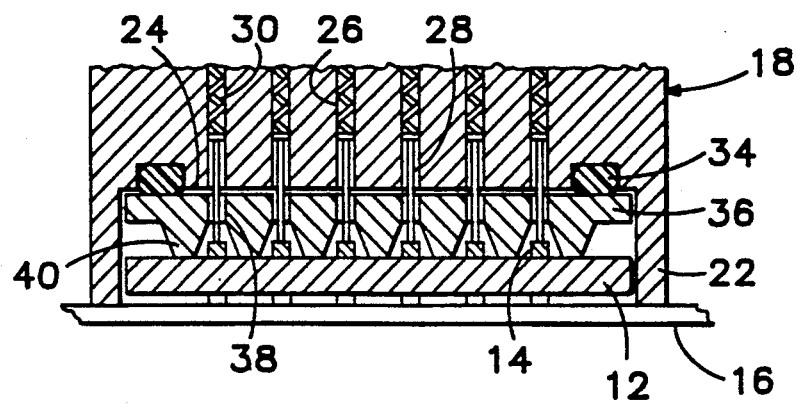

Referring now to FIGS. 1-4 a high density probe 10 is shown for use in probing an integrated circuit package 12 having high density leads 14. The integrated circuit package 12 is mounted on a circuit board 16. The high density probe 10 has a probe housing 18 with a central aperture 20 and an integral skirt 22. The skirt 22 may have air holes 23 around the periphery to provide cooling for the integrated circuit package 12 when the probe 10 is in place over the package. Interior to the skirt 22 and surrounding the central aperture 20 is an integral flange body 24 having a plurality of probe pin holes 26 extending through the flange body in a pattern corresponding to the leads 14. Integral with the flange body 24 are corner sections 25 that form alignment or registration surfaces. The corner sections 25 are configured to mate with the corners of the integrated circuit package 12. In each probe pin hole 26 is compressably mounted a probe pin 28, the compression mounting being in the form of a spring 30 or the like, with the probe pins extending from the probe pin holes into the area within the skirt 22. Compression cavities 32 are formed in the flange body 24 in which a compression member 34 is mounted. The compression member 34 may be an elastomeric that is retained in the cavity 32 by an adhesive, or may be a steel spring that is secured in the cavity by a screw or the like.

An alignment plate 36 having a central aperture is configured to fit on the flange body 24 within the skirt 22, and is attached to the compression member 34 by an adhesive, screw or the like. The fine alignment plate 36 has a plurality of holes 38 corresponding to the probe pin holes 26 of the flange body 24. Between the holes 38 are a series of serrations or ridges 40 that are dimensioned to fit between the leads 14 of the integrated circuit package 12.

Integral with the probe housing 18 is a connector section 42 that provides electrical access to the probe pins 28. The connector section 42 may have a plurality of connectors 44 as shown, one for each probe pin 28, or may have a plurality of flexible cable outlets for connection to a remote electrical connector. As shown, one or more plugs 46 may be connected to any one or more of the connectors 44 to provide an electrical connection via wires 48 with a test and measurement type instrument, such as a multi-channel oscilloscope, a logic analyzer or the like, to observe the signal on the lead 14 to which the particular probe pin 28 associated with that connector 44 is in contact.

Initially the probe housing 18 is placed over the integrated circuit package 12 so that the skirt 22 surrounds the package and the corner sections 25 make contact with the package corners for an initial alignment. Since the contour of the package 12 may not be precisely aligned with the leads 14, this just provides an initial alignment of the probe 10 with the package. Then the probe 10 is pressed down over the package 12 and the serrations 40 of the fine alignment plate 36 mesh with the leads 14 so that the pin holes 26, 38 occur directly over the leads. As the probe 10 is pressed down further until the skirt 22 contacts the circuit board 16, the probe pins 28 extend through the pin holes 38 between the serrations 40 to contact the leads 14. Since the serrations 40 are meshed with the leads 14, there is no possibility that the probe pins 28 can contact more than one lead, eliminating the possibility of a short circuit caused by a probe pin contacting more than one lead. The springs 30 within the probe pin holes 26 assure that the probe pins 28 make a positive contact with the leads 14.

Figure 5:
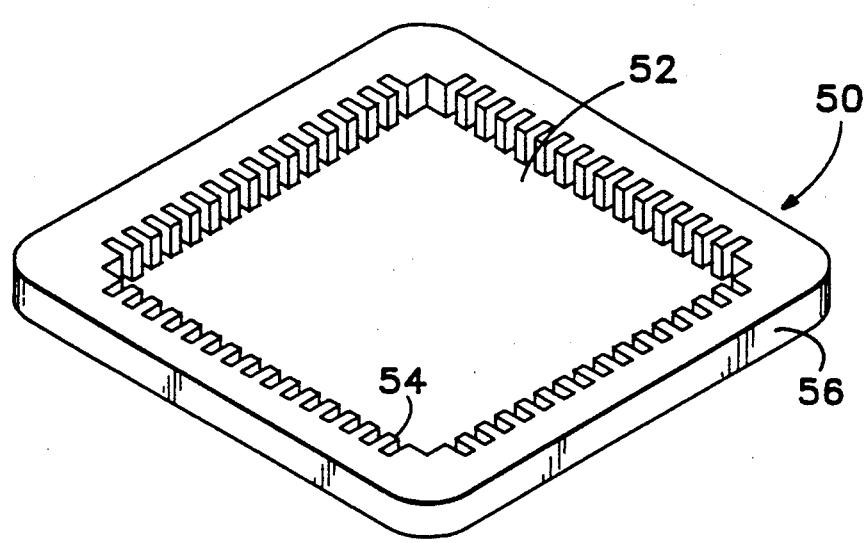
FIG. 5 is a perspective view of a base plate for a high density probe according to the present invention.
Figure 6:
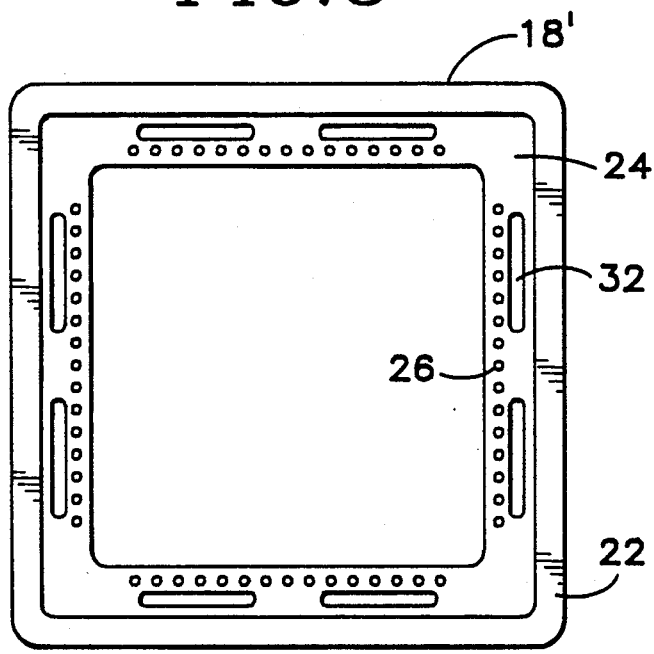
FIG. 6 is a bottom plan view of an alternative probe housing for use with the base plate of FIG. 5.
Figure 7:
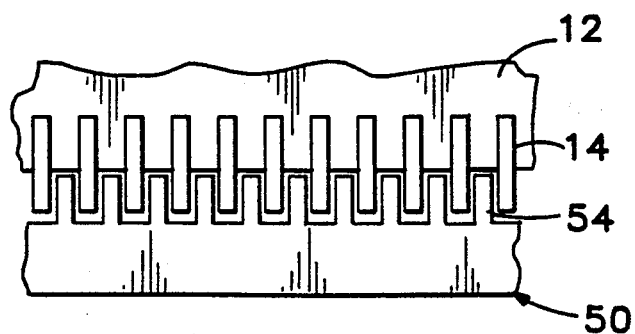
FIG. 7 is a partial illustrative top plan view of the base plate of FIG. 5 engaging an integrated circuit package according to the present invention.

An alternative configuration of the probe 10 as shown in FIGS. 5-7 eliminates the possibility that the corner sections 25, due to initial misalignment of the probe 10 with the package 12, may damage the leads 14 adjacent the corners of the package during the initial alignment process. A base plate 50 has a central aperture 52 with a plurality of teeth 54 extending into the aperture to form a comblike structure. The base plate 50 is placed about the integrated circuit package 12 so that the teeth 54 mesh with the leads 14. The probe housing 18' has skirt dimensions that mate with the exterior edge 56 of the base plate 50, assuring alignment with the leads 14. Then when the probe 10 is pressed down, the serrations 40 again mesh with the leads 14 to assure that each probe pin 28 contacts only one lead. The base plate 50 may be used in lieu of the fine alignment plate 36, but the serrations 40 assure that the pins 28 do not short out adjacent leads 14 should the pins become bent.

Thus the present invention provides a probe for an integrated circuit package having high density leads that has alignment surfaces to align the probe with the package and has a floating alignment plate for aligning the probe pins with the leads, the alignment plate having serrations that mesh with the leads to assure that each probe pin contacts only one lead.

What is claimed is:

1. A probe for an integrated circuit package having high density leads comprising:
   a probe housing having a skirt that extends down over the integrated circuit package with alignment surfaces that align the probe housing with the integrated circuit package, the probe housing including elastically mounted probe pins aligned to make contact with the high density leads; and
   an alignment plate elastically mounted within the probe housing internal of the skirt and having a plurality of serrations on either side of pin holes, the serrations meshing with the high density leads and the probe pins extending through the pin holes to contact the leads when the probe is pressed down on the integrated circuit package.

2. A probe as recited in claim 1 further comprising a base plate having a central aperture and a plurality of teeth extending into the central aperture, the central aperture and teeth being dimensioned to fit over the integrated circuit package with the teeth meshing with the leads, the outer edge of the base plate forming a surface that mates with the alignment surfaces of the probe housing.

3. A probe for an integrated circuit package having high density leads comprising:
   a probe housing having a skirt that extends down over the integrated circuit package, the skirt having alignment surfaces that align the probe housing with the integrated circuit package, the probe housing including elastically mounted probe pins aligned to make contact with the high density leads; and
   a base plate having a central aperture and a plurality of teeth extending into the central aperture, the central aperture and teeth being dimensioned to fit over the integrated circuit package with the teeth meshing with the leads, the outer edge of the base plate forming a surface that mates with the alignment surfaces of the probe housing.

* * * * *